US009927667B2

(12) United States Patent
McGinnis et al.

(10) Patent No.: US 9,927,667 B2
(45) Date of Patent: Mar. 27, 2018

(54) DISPLAY HAVING A TRANSPARENT CONDUCTIVE OXIDE LAYER COMPRISING METAL DOPED ZINC OXIDE APPLIED BY SPUTTERING

(71) Applicant: SCI ENGINEERED MATERIALS, INC., Columbus, OH (US)

(72) Inventors: Robert McGinnis, Chandler, AZ (US); Jing Yang, Lewis Center, OH (US); Tzu-Chieh Lin, Columbus, OH (US)

(73) Assignee: SCI ENGINEERED MATERIALS, INC., Columbus, OH (US)

( * ) Notice: Subject to any disclaimer, the term of this patent is extended or adjusted under 35 U.S.C. 154(b) by 1 day.

(21) Appl. No.: 14/822,514

(22) Filed: Aug. 10, 2015

(65) Prior Publication Data

US 2016/0041418 A1    Feb. 11, 2016

Related U.S. Application Data

(60) Provisional application No. 62/035,790, filed on Aug. 11, 2014, provisional application No. 62/153,818, filed on Apr. 28, 2015.

(51) Int. Cl.
| | | |
|---|---|---|
| *G02F 1/1343* | (2006.01) | |
| *C23C 14/08* | (2006.01) | |
| *H01L 51/52* | (2006.01) | |
| *C23C 14/34* | (2006.01) | |

(52) U.S. Cl.
CPC ........ *G02F 1/13439* (2013.01); *C23C 14/086* (2013.01); *C23C 14/3414* (2013.01); *H01L 51/5206* (2013.01)

(58) Field of Classification Search
CPC .............. G02F 1/13439; G02F 1/1337; G02F 1/133528; C23C 14/34; C23C 14/086; C23C 14/3414; H01L 51/56; H01L 51/0021; H01L 51/0096; H01L 27/3241; H01L 51/206
USPC ........................................................ 349/139
See application file for complete search history.

(56) References Cited

U.S. PATENT DOCUMENTS

| | | | |
|---|---|---|---|
| 5,628,933 | A | 5/1997 | Carter et al. |
| 2005/0140283 | A1 | 6/2005 | Lau et al. |
| 2008/0246407 | A1* | 10/2008 | Yoshida ................ H01L 21/288 315/169.3 |
| 2009/0242887 | A1* | 10/2009 | Yamamoto ............ C23C 14/086 257/59 |
| 2011/0041917 | A1 | 2/2011 | Dauson et al. |
| 2012/0033367 | A1 | 2/2012 | Jones et al. |

OTHER PUBLICATIONS

European Search Report dated Jun. 30, 2016.

* cited by examiner

*Primary Examiner* — Charles Chang
(74) *Attorney, Agent, or Firm* — Hudak, Shunk & Farine Co. LPA

(57) ABSTRACT

The invention provides an alternative liquid crystal and light emitting display which include at least one Transparent Conductive Oxide layers which comprises a zinc oxide doped with a group III, IV, V, or transition metal dopant, and sputtered from a sputtering target. In a further embodiment, this Transparent Conductive Oxide layer can optionally include a layer of a patternable TCO, such as ITO.

28 Claims, 1 Drawing Sheet

DISPLAY HAVING A TRANSPARENT CONDUCTIVE OXIDE LAYER COMPRISING METAL DOPED ZINC OXIDE APPLIED BY SPUTTERING

FIELD OF THE INVENTION

The present invention relates generally to a novel display, such as an LCD or OLED display, having at least one 10-2000 nm (and preferably from 50-400 nm) layer of Transparent Conducting Oxide ("TCO") which is one or more of Metal doped Zinc Oxide ("Metal-ZnO"), deposited by AC or DC magnetron sputtering, or by pulsed laser deposition, and using a target that is doped with metal such as aluminum, gallium and silicon (generally at a level of from 0.05% to 5%, and preferably at 1%, 2%, or 3% each +/− 0.25%) and optionally having an additional layer of TCO, specifically Indium Tin oxide ("ITO"), in the display.

BACKGROUND OF THE INVENTION

A LCD display is not a light generator, but rather a light controller. That light can come from the front of the device and be reflected by a mirror at the back; this is the common application for calculators and watches. They can also get the light from a light source at the back (in place of the mirror and frequently LED's) and then control the light that shines out thru the front. This is the method used for computer monitors and TV's. The basic principle is to have two polarizing filters at some specific angle, such as 45° to 125°, and more preferably 60° to 110°, and most preferably from 80° to 100°. The heart of the device is the liquid crystal layer working as a waveguide to change the polarization of the light. If this remains the case, no light will get thru and the display will be dark, and preferably black (indicating that light in the visible wave range is not transmitted through the display). There are a number of types of liquid crystal and which include, for example, nematic, cholesteric, dichroic, discotic and blue phase liquid crystals, all of which may have advantageous application in the present invention. When a voltage is applied to the liquid crystal layer the organic molecules adjacent to the electrode twist the light polarization allowing it to pass thru to the second polarizing filter for the transmissive LCDs or be reflected back by the mirror and allow the light to pass thru for the reflective LCDs. The invention is also useful in OLED displays. In these organic light-emitting diode (OLED) the display includes a light-emitting diode (LED) in which the emissive electroluminescent layer is a film of organic compound (rather than the liquid crystal types mentioned above) which emits light in response to an electric current. This layer of organic semiconductor is situated between two electrodes; typically, at least one of these electrodes is transparent, and is advantageously the TCO in accordance with the present invention.

The voltage that is applied to the liquid crystal layer is applied thru a TCO. (i.e., a positive electrode) The criteria of good TCO layer are light transmittance—i.e. above 80%, and preferably above 85%, and more preferably above 87% in the visible wavelength—and low sheet resistance i.e. <100, and preferable less than 80 and most preferably less than <50Ω/□. In most applications, voltage is applied on one side thru a pattern that will determine which portion of the liquid crystal will change polarization. The TCO on the other side (called the negative electrode in the picture) completes the circuit. This is not necessarily patterned. For TV's and monitors the pattern becomes a matrix of pixels, and for color LCD's there are red, green and blue sub-pixels with a color mask for each.

SUMMARY OF THE INVENTION

In accordance with the present invention, Metal-ZnO is used alone or in combination with ITO as the negative electrode, while a patternable layer is used for the front. In addition for applications that use seven segment displays such as watches and calculators, the patterning complexity is much reduced from that required for high density pixels, and the ability to pattern the Metal-ZnO would be sufficient to eliminate the need for any additional ITO patterned layer so that this optional layer may be left off of this layer of TCO. An edge seal with the LCD display is used in order to inhibit damp heat degradation of Metal-ZnO.

The primary critical characteristics of a TCO are resistivity, and transmittance. These are controlled by film composition, carrier concentration, film thickness, and the deposition process. The etch-ability and ability to withstand damp heat, are also important parameters. The wide band gap (over 3 eV) n-type conductive oxides such as indium tin oxide (ITO), Metal doped Zinc Oxide (Metal-ZnO), and are two important potential materials for use as a TCO. Applications in which the Metal-ZnO TCO layer of the present invention could be used include rigid LCD and other flat panel displays, touchscreens, flexible displays (such as might be used for wearable electronics movement), organic light emitting diodes (OLED), electronic paper displays and plasma display panels. An additional application area where Metal-ZnO is the primary or a strong candidate for use as a TCO is thin film smart windows or architectural glass.

In accordance with the present invention, the Metal-ZnO is preferably deposited by sputtering, both DC and RF, with variations of the configurations and the deposition parameters depending on the end-use application. Sputtering has the advantage of being able to deposit films with low substrate temperature (<200° C.). This is very important for flexible applications where the conductive film is deposited on plastic films of various types. Another process that could be used with good results with Metal-ZnO is pulsed laser deposition (PLD). While other methods could be used to deposit the TCO layer, in general, the results obtained from these processes are not as good as those obtained from sputtering and PLD.

DETAILED DESCRIPTION OF THE INVENTION

Figure 1:
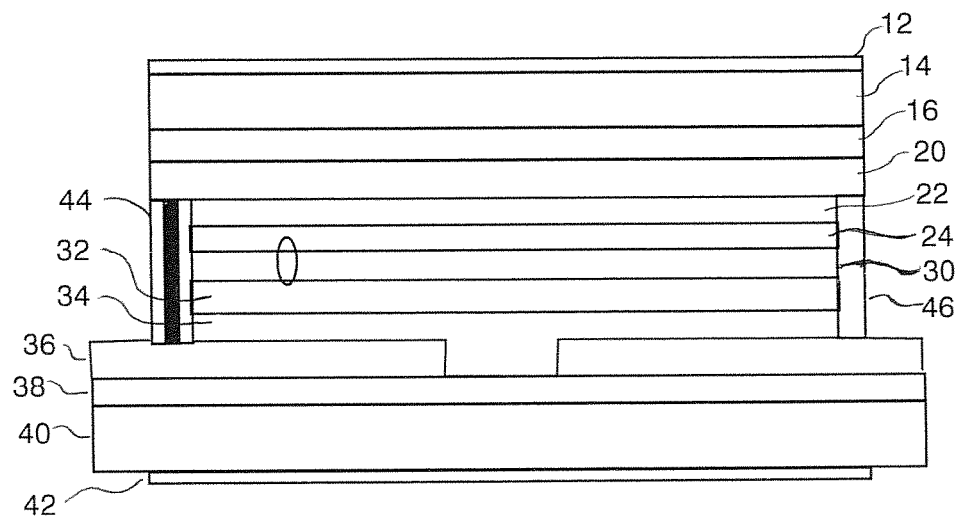
FIG. 1 is a cross section of a liquid crystal display in accordance with the invention.

As in many things in nature the increase in carrier concentration with its resulting decrease in resistivity, causes a reduction in transmittance. In addition, as the concentration becomes fairly high, oxides of the impurity donors start to form reducing the electrical performance. So there is a sweet spot for all of these films.

The resistivity determines the voltage drop across the film as current flows into (or out depending on the application) the device. If the voltage drop is too high, for instance, a display screen might be darker in the center as the current must flow from the edges. This is both a static and dynamic characteristic of the film. Mobility is related to the speed with which the carriers move thru the film. In fact the drift velocity of the carriers is equal to the mobility times the applied voltage field. The implications here are associated with the rate of change of the applied voltage. The practical result is that the refresh rate of displays can be limited by the film mobility.

Transmittance is a key characteristic of the films for use as a TCO. The large band-gap conductive oxides are transparent in the visible light spectrum because the incoming photons do not have enough energy to create hole-electron pairs and cause loss of transparency by absorption. ZnO has a band-gap of 3.37 eV, the addition of impurities changes that number, generally making it a bit higher. At the upper (blue) edge of the visible spectrum the photons have energy around 3.5 eV so light is not absorbed by the film. On the longer wave length (infrared) side the light is reflected due to free electrons. This makes these films ideal for window coatings as they let in the light, and keep out the heat. Metal-ZnO is not as reflective in the shorter wavelength infrared region as ITO. Properly fabricated ITO has transmittance in the visible spectrum of around 80-85%, while Metal-ZnO is a little better in the 85-90% range or higher depending on the film thickness.

Thickness is also a major factor especially for Metal-ZnO as these films are known to have significantly lower performance when they are thinner than 100 nm. This is caused by boundary effects with the deposition surface due to the initial islands formation. Changes in these conditions can have profound effects on the film performance. Such changes result from crystalline structure, oxygen vacancies, and others and are influenced by deposition methods and post processes such as annealing. ITO is successfully deposited with thickness down to 50 nm. ITO mobility is driven primarily by ionized impurity scattering and seems to be somewhat less sensitive to the boundary conditions. Interestingly the Metal-ZnO films deposited on thin film solar cells (CIGS) have thickness ranging from 500-2000 nm. It seems that the higher thickness may be the way to avoid serious degradation of the film in damp heat. Each application has different thickness requirements. Growth Temperature has an impact on the electrical performance of the films. In general the higher temperatures give better results. However, there is a major effort to obtain good results at lower temperatures for deposition on various plastic films, such as polyimide, or polycarbonate such as at temperatures below 100° C., and preferably below 80° C. Deposition rate is an important manufacturing cost factor. The typical rate appears to be about 30 nm/min.

The following chart compares some of the key characteristics of ITO and ZnO based alternatives.

| Film Type | Deposition Method | Thickness nm | Carrier Conc. NX $10^{20}$ | Mobility $\mu = cm^2/Vs$ | Resistivity P = $10^{-4} \Omega \cdot cm$ | Transmittal % |
|---|---|---|---|---|---|---|
| AZO | Magnetron Sputtered, 2% AL dopant | 257 | 5.13 | 15.2 | 4 | 90 |
| AZO | Magnetron Sputtered, 1% AL dopant | 267 | 5.03 | 22.5 | 3.9 | 90 |
| ITO | Sputtered | | 1.25 | 43 | 10 | |
| ITO | Sputtered | | 6.6 | 12 | 8 | |
| ITO | Sputtered | | 10 | 35 | 4 | 80 |
| ITO | Sputtered | 130 | 7 | 26 | 3 | 85 |
| ITO | DC magnetron sputtering | | 9.28 | 41 | 1.63 | |

There are a number of interesting things that can be gleaned from this information and the prior art: Both AZO and ITO are n-type degenerate (means highly doped) semiconductors. Although AZO films have been made that match the resistivity of ITO films, the ITO films generally have better mobility. However, AZO films have better stability at high temperatures and AZO has slightly better transmittance. PLD deposition may provide improved results, however, there is a question how reasonable a process it is for high volume manufacturing. Most of the higher performing AZO films have some differences in technology specifically may be influenced by process changes such as varying the kind of deposition, including, for example: PLD deposition; Co-doping the n-type dopant with a smaller amount of p-type dopant; AZO and Zn put down in sequential layers; use of a Homo-Buffer layer; and post annealing in and reactive or inert atmosphere, such as $H_2$, $N_2$, or $O_2$. For both AZO and ITO the mobility is proportional to the thickness, only ITO seems to be less effected. At least part of this effect is believed to be due to AZO adsorbing $O_2$ at the surface and reducing the number of oxygen vacancies and therefore the number of available free carriers. This is probably also the driver in the damp heat degradation issue. The electrical and optical results are dependent on the deposition process and parameters and specifically things as $O_2$ concentration, Ar concentration, addition of $H_2$, gas pressure, DC or RF magnetron sputtering, substrate type and temperature, and many others. The resistivity of AZO films has been improved over the past 30 years going from over 6 to about $1 \times 10^{-4}$ $\Omega \cdot cm$ with relatively thick film, while the best ITO films have remained about the same in the range of $1 \times 10^{-4}$ $\Omega \cdot cm$. The required mobility, although it tends to track with the resistivity.

Solid Panel LCD

This technology serves the LCD TVs, computer monitors, and other non-touch screen applications. The property requirements for this application are:

| Location | Substrate material | Deposition temp. ° C. | Film thickness nm | Resistivity $\Omega \cdot cm$ | Sheet resistance $\Omega$/square |
|---|---|---|---|---|---|
| TFT side | Glass | Approx. 200 | 35-140 | $4\text{-}8 \times 10^{-4}$ | 30-120 |
| CF side | Glass | <200 | 120-160 | $1.6\text{-}4 \times 10^{-4}$ | 16-30 |

The Metal-ZnO thin films suitable for the present invention meet the resistivity requirements and appear to be in the desired range for thickness and resistivity.

Plasma Display Panels

Plasma display panels have used in flat screen TVs and other similar applications. They have the advantage of better picture quality and viewing at large off normal angles than LCD TVs, and the disadvantage of high power dissipation.

The TCO properties requirements for this application are:

| Substrate material | Deposition temp. °C. | Film thickness nm | Resistivity $\Omega \cdot cm$ | Sheet resistance $\Omega$/square |
|---|---|---|---|---|
| Glass | Approx. 200 | 150-200 | $2\text{-}3 \times 10^{-4}$ | <20 |

Touch Screen Panels

There are two principal technologies for touch screens; resistive (which usually requires some sort of a stylus) and capacitive. Metal-ZnO is suitable for both technologies Resistive Resistive touch screens are favored because of low cost; however they can wear out due to continuous flexing of the top layer. Metal-ZnO is potentially useful in this type of device. This uses the piezoelectric properties of the ZnO to generate a voltage at the touch point.

The table below is for the high sheet resistance TCO film where the pressure from the stylus generates the contact signal. There may also be applications that can use a thicker film.

| Substrate material | Deposition temp. °C. | Film thickness nm | Resistivity $\Omega \cdot cm$ | Sheet resistance $\Omega$/square |
|---|---|---|---|---|
| Glass, plastic | <200 | 10-30 | | 250-500 |

Capacitive

The requirements for ITO films in these applications are currently in the range of 100-250 nm.

Other potential applications include OLED, and Flexible Displays and Electronic Paper Displays (EPD).

FIG. 1 is a cross-section of a liquid crystal display 10 as a representation of a first embodiment of the invention. The layers are as follows going from top to bottom in the figure: front polarizer 12 (which is usually included), the substrate 14 which can be rigid such as glass—can be soda lime or borosilicate, or can be flexible, such as transparent polymers including, for example, polycarbonate polyimide or PET, a barrier layer 16, such as an $SiO_2$ undercoat—to block Na from the glass; a TCO layer 20, which in this case is Metal-ZnO alone or in combination with Indium Tin Oxide—a second barrier layer 22—this is usually $SiO_2$, an LC alignment layer 24—typically rubbed polyimide for LC alignment which is not necessary when the light emissive layer is an organic light emitting diode (OLED), the light emissive layer, in this instance a Liquid Crystal material and spacers 30, a second LC alignment layer 32 which is again not necessary for the OLED, a third barrier layer 34, a second transparent conductive oxide layer 36, which is either the same Metal ZnO alone or with ITO or just ITO, a fourth barrier layer 38, an optional second substrate layer 40 and an optional rear polarizer and reflector 42. On one side, the cell includes a conductive cross-over 44, and on the other side a seal 46. A Hybrid Liquid Crystal Display (HLCD) in accordance with the invention would be one with the top layer of ITO partially or totally replaced with a metal doped zinc oxide with one or more elements from group III, IV, V or transition metal dopants such as boron, aluminum, gallium, silicon, titanium, niobium and indium at dopant levels of less than 5%, and preferably less than 3%, and optionally including co-dopants, such as less than 1% silicon, aluminum, or gallium.

Figure 2:
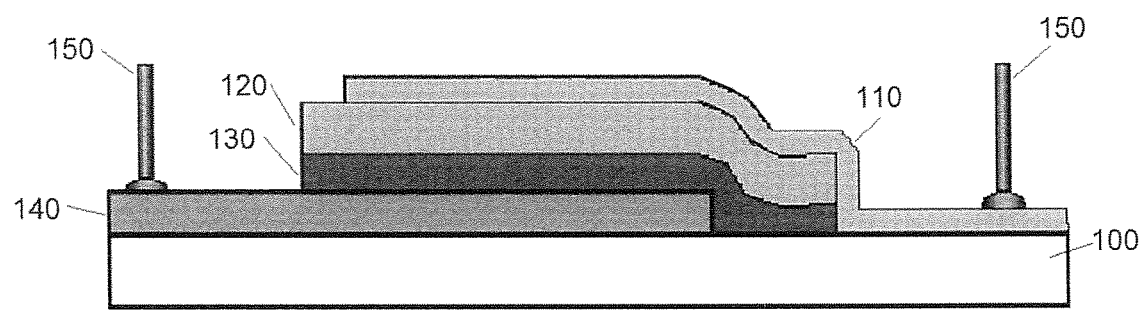
FIG. 2 is a cross section of an organic light emitting display in accordance with the invention.

FIG. 2 is an illustration of an OLED display 105 in accordance with the present invention. Starting from the top and working downward through the layers, the top layer is a cathode 110, which is over the light emitting layer 120, which is over the conductive layer 130, and the next layer is the anode layer that is the transparent conductive oxide layer (TCO) which is a metal oxide layer in accordance with the present invention, and the bottom layer is the substrate, which is glass or an appropriate transparent plastic material. The display also includes posts 150.

In accordance with the present invention, ZnO based sputtering targets were fabricated using the following method. A pressing powder was prepared by mixing oxides of the dopant metal with ZnO in water containing an organic binder, then spray drying the resultant slurry to obtain a free flowing powder. The powder was loaded into a die and was formed using cold isostatic pressing (CIP). The pre-formed green body was sintered at temperatures above 1000° C. for more than 1 hour to obtain a dense ceramic, preferably higher than 95%. The ceramic was diamond ground to obtain the final dimensions.

For the resulting target, the density and the microstructure were measured. The density was in the desired range of 75-100%, and preferably above 90%. The density achieved was above 95% theoretical density ("TD"). The microstructure was also in the desired range of from 25-100 μm, preferably less than 50 μm grain size, and more preferably less than 20 μm. The resistivity of the thin film by DC sputtering using the target is lower or in the range of 1E10–3 $\Omega \cdot cm$ with the thickness less than 300 nm, and preferably less than 200 nm.

In accordance with the patent statutes, the best mode and preferred embodiment have been set forth; the scope of the invention is not limited thereto, but rather by the scope of the attached claims.

What is claimed is:

1. A liquid crystal display having at least the following layers:
   a front polarizer,
   a transparent substrate of glass or plastic,
   a first transparent conductive oxide having a transmittance in the visible wavelength of at least 80% and comprising a layer of metal doped zinc oxide applied by sputtering and comprising a zinc oxide doped with a metal at a level of level of from 0.05% to less than 3%,
   a liquid crystal alignment layer,
   a liquid crystal layer, and
   a second transparent conductive oxide layer including a pattern in the layer.

2. A liquid crystal display as set forth in claim 1 wherein the second transparent conductive oxide layer includes a pattern in the layer.

3. A liquid crystal display as set forth in claim 1 wherein the second transparent conductive comprises indium tin oxide.

4. A liquid crystal display as set forth in claim 1 wherein the first transparent conductive layer is from about 10 to about 2000 nm in thickness.

5. A liquid crystal display as set forth in claim 4 wherein the first transparent conductive layer is from about 50 to about 400 nm in thickness.

6. A liquid crystal display as set forth in claim 1 wherein the first transparent conductive layer is deposited using a sputtering target by magnetron sputtering or by pulsed laser deposition.

7. A liquid crystal display as set forth in claim 1 wherein the metal used for the doping comprises one or more of aluminum or gallium alone, or in combination with each other, and one or more of indium or silicon.

8. A liquid crystal display as set forth in claim 1 wherein the metal used for doping is at a level of 0.05% to 2%.

9. A device having at least the following layers:
a transparent substrate of glass or plastic;
a transparent conductive oxide comprising a layer of zinc oxide doped with less than 3% of a dopant, a group III, IV, V, or transition metal dopant, and applied by sputtering; and
a liquid crystal layer and a liquid crystal alignment layer or a light emitting layer.

10. A device as set forth in claim 9, wherein the transparent conductive oxide is zinc oxide doped with one or more from group III, IV, V, or transition metal dopant.

11. A device as set forth in claim 10 wherein the zinc oxide is doped with aluminum or gallium alone, or in combination with each other, and optionally including indium.

12. A device as set forth in claim 11 wherein the transparent conductive oxide layer also includes less than 1% of a co-dopant.

13. A device as set forth in claim 12 wherein the co-dopant is boron, silicon, titanium, niobium or indium.

14. A device as set forth in claim 9, which is one of a liquid crystal display or an organic light emitting diode display.

15. A device as set forth in claim 9 wherein the dopant is at a level of 0.05% to 2%.

16. A method of making a device comprising the steps of forming a composite comprising, a transparent substrate of glass or plastic, a transparent conductive oxide comprising a layer of zinc oxide doped with a group III, IV, V, or transition metal dopant, a liquid crystal layer and a liquid crystal alignment layer or a light emitting layer, and including the step of applying the transparent conductive oxide layer to the transparent substrate layer by sputtering unto the substrate from a sputtering target having a microstructure having an average grain size of less than 100 µm and density of more than 75% TD.

17. A method of making a device as set forth in claim 16 wherein the device is a liquid crystal, LED or OLED display.

18. A method of making a device as set forth in claim 17 wherein the sputtering target has an average grain size of 20 µm and density of 95% TD and above.

19. A display having at least the following layers:
a transparent substrate of glass or plastic;
a first transparent conductive oxide comprising a layer of metal doped zinc oxide which includes a dopant of aluminum or gallium at less than 3% and a co-dopant of less than 1% of silicon, aluminum or gallium, and the first conductive oxide layer is applied by sputtering from a sputtering target having a microstructure having an average grain size of 25-100 µm and density of more than 75% TD;
a light emissive layer; and
a second transparent conductive oxide layer.

20. A display as set forth in claim 19 wherein the density of the sputtering target is above 90%.

21. A display as set forth in claim 19 in the microstructure is less than 50 µm grain size.

22. A display as set forth in claim 21 in the microstructure is less than 20 µm grain size.

23. A display as set forth in claim 19 wherein a first transparent conductive oxide is applied by DC sputtering.

24. A display as set forth in claim 19 in which the resistivity of the first transparent conductive oxide is in the range of 1E10–3 Ω·cm at a thickness of less than 300 nm.

25. A display as set forth in claim 24 in which the resistivity of the first transparent conductive oxide is in the range or lower than 1E10–3 Ω·cm at a thickness of less than 200 nm.

26. A display as set forth in claim 19 wherein the dopant is at a level of 0.05% to 2%.

27. A display device having at least the following layers:
a transparent substrate of glass or plastic;
a first transparent conductive oxide comprising a layer of metal doped zinc oxide including a dopant of aluminum or gallium alone, or in combination with each other, and optionally including indium and applied by sputtering from a sputtering target having a microstructure having an average grain size of 25-100 µm and density of more than 75% TD, and the first transparent conductive oxide having a resistivity of from 1E10 to 3 Ω·cm at a thickness of less than 300 nm;
a light emissive layer; and
a second transparent conductive oxide layer.

28. A device as set forth in claim 27 wherein the dopant is at a level of 0.05% to 2%.

* * * * *